(12) United States Patent
Wei et al.

(10) Patent No.: US 9,256,121 B2
(45) Date of Patent: Feb. 9, 2016

(54) MASK PLATE AND A METHOD FOR PRODUCING A SUBSTRATE MARK

(71) Applicants: BOE Technology Group Co., Ltd., Beijing (CN); Chengdu Boe Optoelectronics Technology Co., Ltd., Chengdu (CN)

(72) Inventors: Xiaodan Wei, Beijing (CN); Xingqiang Zhang, Beijing (CN); Wei Zhao, Beijing (CN); Hongxu Yan, Beijing (CN)

(73) Assignees: Boe Technology Group Co., Ltd., Beijing (CN); Chengdu Boe Optoelectronics Technology Co., Ltd., Chengdu (CN)

( * ) Notice: Subject to any disclaimer, the term of this patent is extended or adjusted under 35 U.S.C. 154(b) by 0 days.

(21) Appl. No.: 14/501,194

(22) Filed: Sep. 30, 2014

(65) Prior Publication Data

US 2015/0331310 A1    Nov. 19, 2015

(30) Foreign Application Priority Data

May 14, 2014    (CN) .......................... 2014 1 0203162

(51) Int. Cl.
| | |
|---|---|
| G03F 1/40 | (2012.01) |
| G03F 1/42 | (2012.01) |
| G03F 1/38 | (2012.01) |
| G03F 7/40 | (2006.01) |
| G03F 7/42 | (2006.01) |
| G03F 7/20 | (2006.01) |

(52) U.S. Cl.
CPC .. G03F 1/38 (2013.01); G03F 7/20 (2013.01); G03F 7/40 (2013.01); G03F 7/42 (2013.01)

(58) Field of Classification Search
CPC ..................................... G03F 1/38; G03F 1/72
USPC ............................................................ 430/5
See application file for complete search history.

(56) References Cited

U.S. PATENT DOCUMENTS 5,843,600 A * 12/1998 Chu et al. ......................... 430/22
6,801,313 B1 * 10/2004 Yokota ........................... 356/401

* cited by examiner

*Primary Examiner* — Stephen Rosasco
(74) *Attorney, Agent, or Firm* — Calfee, Halter & Griswold LLP

(57) ABSTRACT

The general inventive concepts relate to the field of display technology, and provide a mask plate and a method for producing a substrate mark to increase the accuracy of the production of a substrate mark, and decrease the difficulty in monitoring products and the production cost. An exemplary mask plate comprises: a display region mask part; at least one pair of test mark mask parts, a test mark mask part being located on either side of the display region mask part and their positions being opposite to each other; and a protection mark mask part correspondingly disposed on the outside of each test mark mask part relative to the display region mask part, wherein the pattern outline of the protection mark mask part is larger than that of the test mark mask part.

5 Claims, 4 Drawing Sheets

MASK PLATE AND A METHOD FOR PRODUCING A SUBSTRATE MARK

RELATED APPLICATIONS

The present application claims the benefit of Chinese Patent Application No. 201410203162.5, filed May 14, 2014, the entire disclosure of which is incorporated herein by reference.

FIELD

The general inventive concepts relate to the field of display technology, and in particular, to a mask plate and a method for producing a substrate mark.

BACKGROUND

With the continuous progress of production technology, the display panel production line has been developed from the line of the first generation (in which the size of a glass substrate is 300 mm×400 mm) to the present line (in which the size of a glass substrate is 2850 mm×3050 mm). Since new products are continuously being developed and put into production, the difficulty in monitoring and managing products is exacerbated.

In order for a test device to detect the relative position of a particular display panel on a substrate, every display panel is designed with a test mark in the periphery of a display region. In order to increase the utilization rate of the glass substrate, the area of the display region is designed to be larger and larger. However, limited by the precision of an exposure device, some test marks need to be designed to be in a double exposure region. In general, in order to protect the photoresist at the position where the test marks in the double exposure region are located from being exposed out at the time of the second exposure, a protection mark of the same size as the test mark is further designed in the periphery of the display region.

The test mark and the protection mark may be formed together with the pattern of the display region by means of a patterning process. In conventional processes, the precision of placement of the exposure device was necessarily high. If there was a positional deviation between the first exposure and the second exposure of the substrate, it would result in the produced test mark falling outside the intended pattern outline size, and thereby failing to achieve the test purpose. As such, conventional processes not only proved unfavorable to monitoring of products, but also could result in large loss of product and investment.

SUMMARY

With respect to the above-mentioned drawbacks of the prior art, the general inventive concepts provide a mask plate and a method for producing a substrate mark using the mask plate which can overcome these drawbacks and problems, at least in part. Thereby, production costs are reduced and accuracy of production of a substrate mark may be improved.

In certain exemplary embodiments, there is provided a mask plate comprising: a display region mask part; at least one pair of test mark mask parts, each pair of test mark mask parts being located on either side of the display region mask part and their positions being opposite to each other; and a protection mark mask part correspondingly disposed on the outside of each test mark mask part far from the display region mark part. The pattern outline of the protection mark mask part being larger than that of the test mark mask part.

In certain exemplary embodiments, the shape of the test mark mask parts may be square, triangular or circular, etc., and accordingly, the shape of the protection mark mask part may also be square, triangular or circular, etc.

In certain exemplary embodiments, the shape of the test mark mask parts may be the same as that of the protection mark mask part. This facilitates full coverage the test marks by the protection mark mask part in the double exposure region.

In certain exemplary embodiments, a method for producing a substrate mark is provided. The method comprising the following steps: forming a material layer on a substrate plate; forming a photoresist layer on the material layer; and exposing every panel region of the substrate in sequence using a mask plate according to an embodiment of the disclosure. Wherein, when two neighboring panel regions have a double exposure region, the positions of the test mark mask parts and the protection mark mask part on one side of the mask plate at the time of the first exposure coincide with those of the protection mark mask part and the test mark mask parts on the other side of the mask plate at the time of the second exposure, respectively.

Because the pattern outline of the protection mark mask part of the mask plate is larger than that of the test mark mask parts in the above method, when the mask plate is used to expose two neighboring panel regions having a double exposure region, it is more likely that the pattern outline size of the test mark is consistent with its theoretical design. Thus, even if there is a positional deviation between the first exposure and the second exposure, the pattern outline size of the test mark is consistent with its theoretical design. Therefore, using the method for producing a substrate mark, the accuracy of the production can be increased, difficulty in monitoring products is decreased, and the production cost are lowered.

In an embodiment of the method for producing a substrate mark, the method further comprises the steps of developing, etching and photoresist stripping after the exposure of the substrate. In general, after undergoing the exposure step, the substrate further needs to undergo the patterning process steps such as developing, etching and photoresist stripping, etc. so as to be able to obtain the desired substrate mark.

BRIEF DESCRIPTION OF THE DRAWINGS

Various aspects, features and advantages of the general inventive concepts will be more easily understood according to the following detailed description and the appended drawings, wherein.

It should be noted that these drawings are merely illustrative, and are not necessarily drawn to scale. In different drawings, like elements are generally denoted using like reference numerals.

DETAILED DESCRIPTION

Various embodiments will be further described in detail in conjunction with the drawings. The embodiments described herein are provided merely for illustration and are not intended to limit the scope of the claims. Those of skill in the art will recognize that various other modifications and combinations are possible and still fall within the scope of the general inventive concepts.

Figure 1:
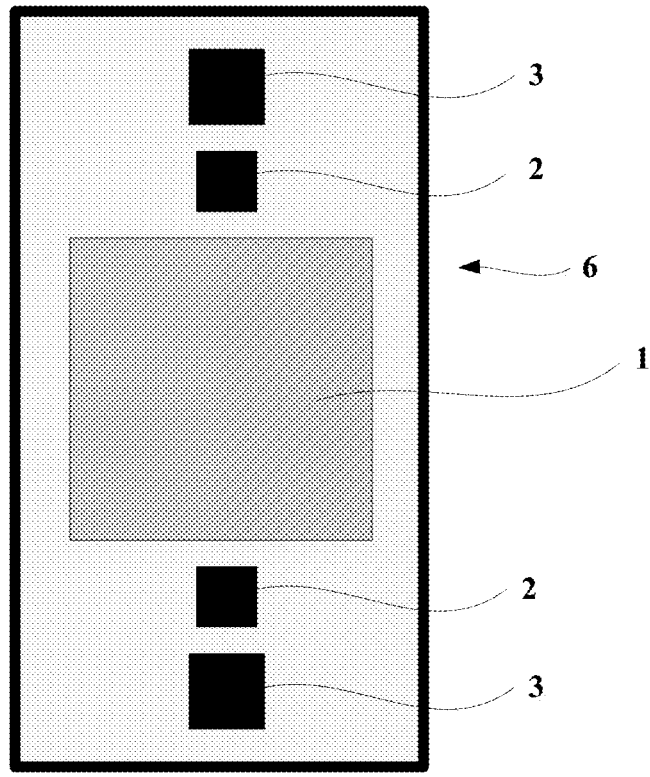
FIG. 1 shows a structure diagram of a mask plate according to an embodiment.

FIG. 1 shows a structure diagram of a mask plate 6 according to an exemplary embodiment. As shown in FIG. 1, the mask plate 6 comprises: a display region mask part 1; at least one pair of test mark mask parts 2, each of the test mark mask parts 2 being located on either side of the display region mask part 1 and their positions being opposite to one another; and a protection mark mask part 3 correspondingly disposed on the outside of each test mark mask part 2 relative to the display region mark part 1, in addition the pattern outline of the protection mark mask part 3 is larger than that of the test mark mask part 2.

As shown in FIG. 1, the shapes of the test mark mask part 2 and the protection mark mask part 3 are both square. However, it will be clear to those of skill in the art that the shapes of the test marks and corresponding protection marks on the substrate may be any shape such as a square, a triangle or a circle, etc., and therefore the test mark mask parts 2 and the protection mark mask part 3 in the mask plate 6 for producing a substrate mark as shown in FIG. 1 may be of any shape such as a square, a triangle or a circle, etc. In addition, in the embodiment as shown in FIG. 1, the shapes of the test mark mask parts 2 and the protection mark mask parts 3 are identical, i.e., square. In this regard, when producing a substrate mark utilizing the mask plate, the test marks are better protected from deformation due to double exposure through enhanced coverage.

However, it should be noted that in the mask plate 6 as shown in FIG. 1, whatever shapes the two kinds of mask parts 2, 3 adopt and whether the shapes are identical or not, it needs to be guaranteed that the pattern outline of the protection mark mask part 3 is larger than that of the test mark mask part 2. Only in this way, can the test marks be adequately protected. This is further described in detail with reference to a method for producing a substrate mark according to an embodiment of the disclosure as shown in FIG. 2.

Figure 2:
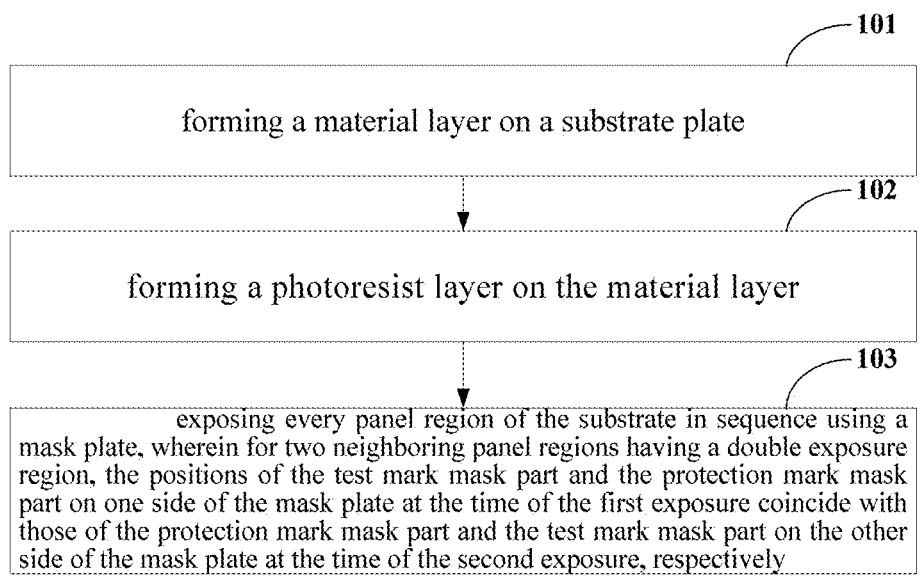
FIG. 2 shows a schematic flow chart of a method for producing a substrate mark according to an embodiment.

FIG. 2 shows a schematic flow chart of a method for producing a substrate mark according to an exemplary embodiment. As shown in FIG. 2, the method for producing a substrate mark according to the disclosure may comprise the following steps:

step 101: forming a material layer on a substrate plate;

step 102: forming a photoresist layer on the material layer; and step 103: exposing every panel region of the substrate in sequence using a mask plate 6 according to an exemplary embodiment as shown in FIG. 1. Wherein, if two neighboring panel regions have a double exposure region, the positions of the test mark mask part and the protection mark mask part on one side of the mask plate at the time of the first exposure coincide with those of the protection mark mask part and the test mark mask part on the other side of the mask plate at the time of the second exposure.

In the following, step 103 will be described in detail with reference to FIG. 3 and FIG. 4, namely, how to use the mask part 6 as shown in FIG. 1 to expose individual regions of the panel to form a desired substrate mark.

Figure 3:
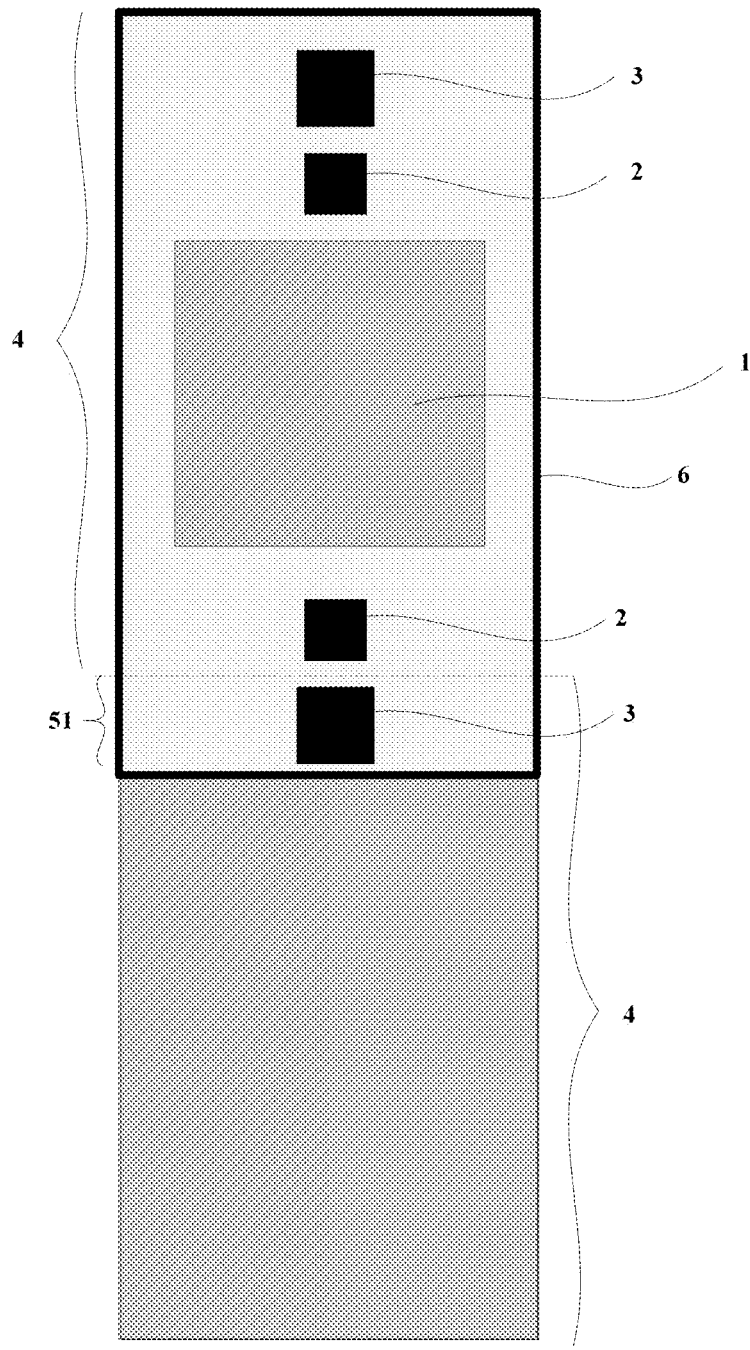
FIG. 3 shows a schematic diagram of the relative positions between two neighboring panel regions and the mask plate at the time of the first exposure in a method for producing a substrate mark according to an embodiment.
Figure 4:
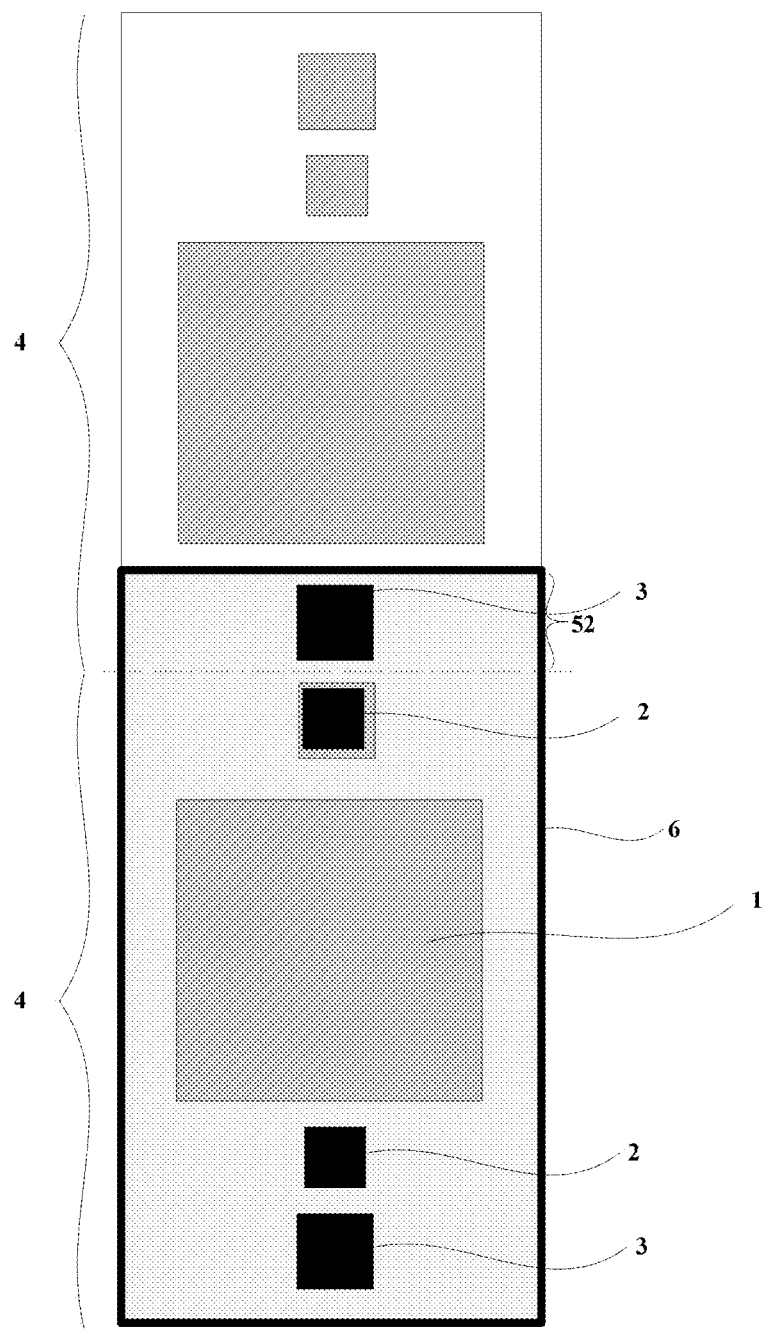
FIG. 4 shows a schematic diagram of the relative positions between two neighboring panel regions and the mask plate at the time of the second exposure in a method for producing a substrate mark according to an embodiment.

FIG. 3 and FIG. 4 respectively show schematic diagrams of the relative positions between two neighboring panel regions 4 and the mask plate 6 at the time of the first exposure (FIG. 3) and the second exposure (FIG. 4) according to step 103 of the method for producing a substrate mark as shown in FIG. 2.

As shown in FIG. 3 and FIG. 4, regarding exposure precision, the size of the mask plate 6 is larger than the size of the substrate panel region 4. Therefore, the area of one-time exposure of the substrate utilizing the mask plate 6 is obviously larger than the area of the panel region 4. When one mask plate 6 is employed to expose two neighboring panel regions 4, respectively, there is necessarily a region doubly (repeatedly) exposed between these two panel regions 4. For example, for the region 51 as shown in FIG. 3 and the region 52 as shown in FIG. 4, these two regions constitute a double exposure region.

As shown in FIG. 4, it can be seen from the relative positional relationship between the panel region 4 and the mask plate 6 at the time of the second exposure that, for two neighboring panel regions 4, the positions of the test mark mask part 2 and the protection mark mask part 3 on one side (the lower side) of the mask plate 6 at the time of the first exposure respectively coincide with those of the protection mark mask part 3 and the test mark mask part 2 on the other side (the upper side) of the mask plate 6 at the time of the second exposure.

As shown in FIG. 4, the outline pattern of the protection mark mask part 3 of the mask plate 6 is larger than that of the test mark mask part 2. Thus, when the mask plate 6 is used to expose two neighboring panel regions 4 having a double exposure region, it can be guaranteed that the pattern outline size of the test mark is consistent with its theoretical design and deformation will not happen, even if there is a positional deviation between the first exposure and the second exposure.

In the prior art, the pattern outline of the protection mark is closely matched to that of the test mark. However, during the second exposure, there might be a positional deviation compared to the first exposure. This could result in the protection mark mask part 3 not aligning completely with the test mark formed by the first exposure. As such, the exposed portions may be unnecessarily exposed. If this occurs, the pattern of the desired test mark is deformed or lessened. However, in the embodiment as shown in FIG. 4, the pattern outline of the protection mark mask part 3 of the mask plate 6 is larger than that of the test mark. Thus, even if there is a deviation between the two exposures, the greater size of the protection mark mask part will allow for a greater positional deviation of the test mark an correspondingly provide greater protection. Thereby undesired deformation of the test mark due to double exposures is avoided.

In addition, the exposure accuracy must be validated by monitoring the central position of the pattern. During production, a measuring machine determines the central position of a test mark by measuring an edge of the mask. Conventionally, since the protection mark mask part is closely matched to the test mark mask part, the test mark itself might be deformed after exposure. When this occurs, the measuring machine cannot accurately determine the real mark position, thus the monitoring fails, and defects may occur. On the contrary, using the method for producing a substrate mark according to the above embodiments, the deformation of the test mark is effectively avoided, and thereby the accuracy of the production of a substrate mark can be increased and the difficulty in monitoring products and the production cost can be decreased.

It should be noted that, after undergoing the above-described method for producing a substrate mark, especially the exposure step 103, the substrate further needs to undergo the patterning process steps such as developing, etching and photoresist stripping, etc. so as to be able to obtain the desired substrate mark.

Figure 5:
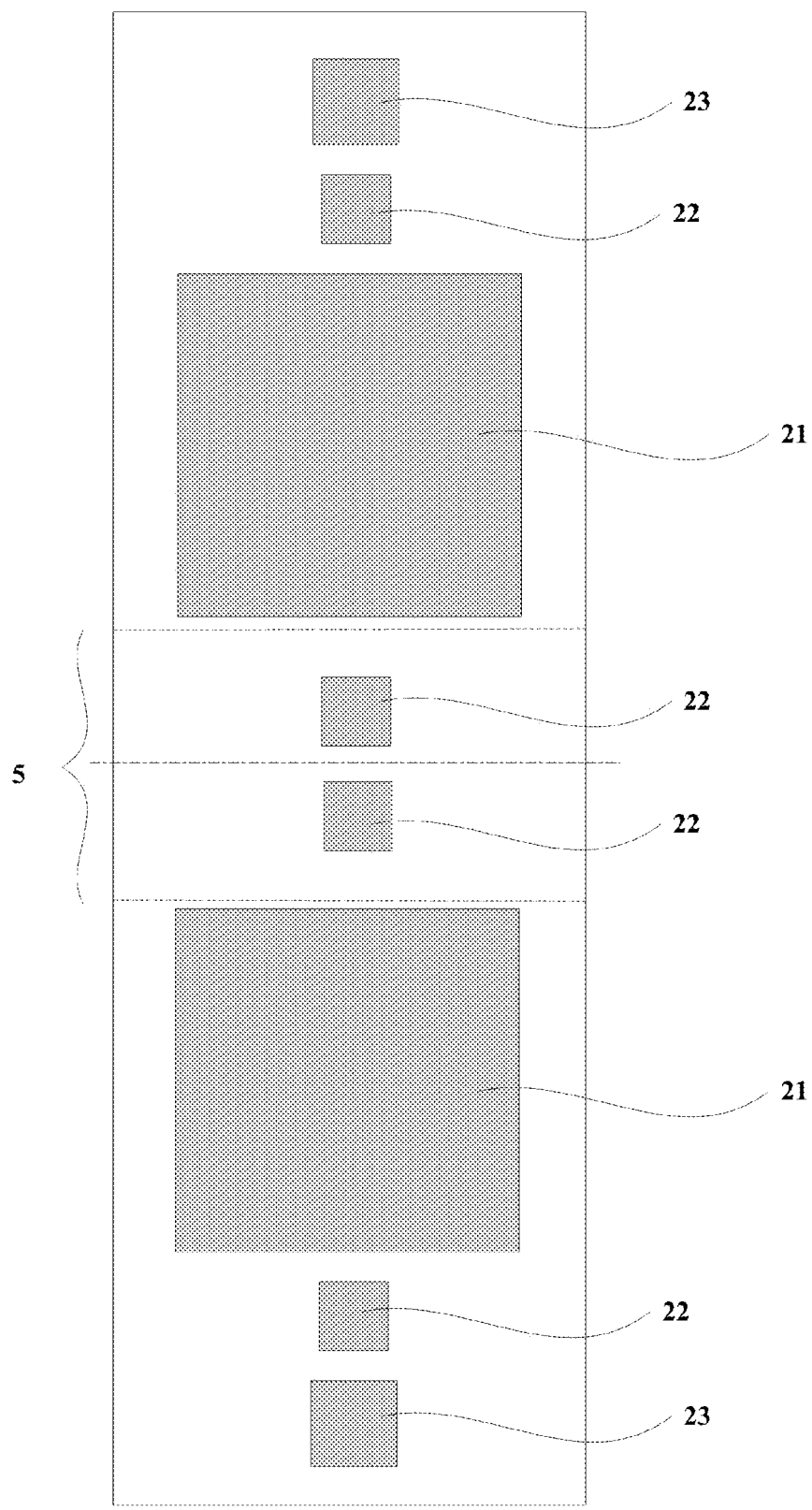
FIG. 5 shows a pattern diagram of two neighboring panel regions undergoing an exemplary patterning processes.

FIG. 5 shows a graphical diagram of two neighboring panel regions obtained ultimately after undergoing an exemplary patterning process. As shown in FIG. 5, both the patterns of these two panel regions comprise a display region 21, a protection mark 23 and a test mark 22. What's more, FIG. 5 further shows the double exposure region 5 of the two neighboring panels, which corresponds to both the respective double exposure regions 51 and 52 of the two panels as shown in FIG. 3 and FIG. 4.

Although the present disclosure has been described with reference to specific embodiments, it should be understood that the limitations of the described embodiments are provided merely for purpose of illustration and are not intended to limit the present invention and associated general inventive concepts. Instead, the scope of the present invention is defined by the appended claims, and all variations and equivalents that fall within the range of the claims are intended to be embraced therein. Thus, other embodiments than the specific exemplary ones described herein are equally possible within the scope of these appended claims.

The invention claimed is:

1. A mask plate comprising:
   a display region mask part;
   at least one pair of test mark mask parts, a test mark mask part of the pair of test marks mask parts being located on either side of the display region mask part respectively and the two test mark mask parts' positions being opposite to each other; and
   a protection mark mask part correspondingly disposed on the outside of each test mark mask part relative to the display region mask part, wherein the pattern outline of the protection mark mask part is larger than that of the test mark mask part.

2. The mask plate according to claim 1, wherein the shape of the test mark mask part comprises a square, a triangle or a circle, and the shape of the protection mark mask part comprises a square, a triangle or a circle.

3. The mask plate according to claim 1, wherein the shape of the test mark mask part is the same as that of the protection mark mask part.

4. A method for producing a substrate mark comprising the following steps:
   forming a material layer on a substrate plate;
   forming a photoresist layer on the material layer; and
   exposing every panel region of the substrate in sequence using the mask plate as claimed in claim 1 or 2, wherein for two neighboring panel regions having a double exposure region, the positions of the test mark mask part and the protection mark mask part on one side of the mask plate at the time of the first exposure coincide with those of the protection mark mask part and the test mark mask part on the other side of the mask plate at the time of the second exposure, respectively.

5. The method according to claim 4, further comprising the steps of developing, etching and photoresist stripping after the exposure of the substrate.

* * * * *